United States Patent
Huang et al.

(10) Patent No.: US 6,552,889 B1
(45) Date of Patent: Apr. 22, 2003

(54) CURRENT LIMITING TECHNIQUE FOR HYBRID POWER MOSFET CIRCUITS

(75) Inventors: John Huang, San Jose, CA (US); Hamza Yilmaz, Saratoga, CA (US); Mohamed N. Darwish, Campbell, CA (US); Wharton McDaniel, San Jose, CA (US); Kyle Terrill, Santa Clara, CA (US); Peter Tu Dang, San Jose, CA (US)

(73) Assignee: Vishay Siliconix, Santa Clara, CA (US)

( * ) Notice: Subject to any disclaimer, the term of this patent is extended or adjusted under 35 U.S.C. 154(b) by 0 days.

(21) Appl. No.: 09/908,178

(22) Filed: Jul. 17, 2001

(51) Int. Cl.[7] .................................................. H02H 3/00
(52) U.S. Cl. ..................................................... 361/93.1
(58) Field of Search ........................... 361/78, 87, 93.1, 361/93.7, 93.9, 100, 101; 363/50, 55, 56.01

(56) References Cited

U.S. PATENT DOCUMENTS

| | | | |
|---|---|---|---|
| 5,841,649 A | * 11/1998 | Willett et al. | 363/98 |
| 5,872,460 A | * 2/1999 | Bennett et al. | 324/769 |
| 5,877,646 A | * 3/1999 | Jorg | 327/374 |
| 6,008,627 A | * 12/1999 | Narita | 320/134 |
| 6,337,591 B1 | * 1/2002 | Maggiolino | 327/172 |

* cited by examiner

Primary Examiner—Matthew Nguyen
(74) Attorney, Agent, or Firm—Wagner, Murabito, Hao LLP (57) ABSTRACT

A power FET and a replica FET on a semiconductor chip coupled to a logic control circuit on a second semiconductor chip within a single housing. A power FET and a scaled down replica of the power FET are disposed on a semiconductor chip. The power FET is used as a switch to couple a DC power source to a load. A fraction of the power FET drain current passes through the replica FET and an external resistance. When the voltage across the external resistance exceeds a maximum value based upon the maximum allowable power FET drain current, the logic control circuit enters into a pulsed gate (PG) mode of operation. The first step in the PG mode is to switch both FETs into a non-conducting state for a predefined period of time. After this time period, a ramp voltage applied between gate and source of both FETs will switch them back into a current conducting state while holding the power FET drain current below its upper limit in the presence of a high capacitance load. If the voltage across the external resistance increases above the maximum, the PG mode of operation continues. PG mode of operation ceases and normal operation follows when the external resistance voltage remains below the established maximum. The combination of predefined nonconducting time and maximum drain current ensures operation of the power FET below maximum power dissipation limits. The PG mode of operation eliminates the need for additional temperature and thermal control circuits.

28 Claims, 8 Drawing Sheets

CURRENT LIMITING TECHNIQUE FOR HYBRID POWER MOSFET CIRCUITS

BACKGROUND OF THE INVENTION

1. Field of the Invention

The present invention relates to the field of semiconductor power switches. More particularly, the present invention relates to limiting the current in a power field effect transistor being used as a switch.

2. Related Art

Traditionally current limiting in a power switch has been done by a method called fold back current limiting. When using a FET as a power switch, the gate to source voltage ($V_{GS}$) of the FET is the control voltage that is regulated in order to limit the FET drain current to a predefined level. The disadvantage of the fold back current limiting approach is that the voltage between the drain terminal and the source terminal ($V_{DS}$) must be increased as $V_{GS}$ is being reduced in order to keep the current at a predefined level. This forces the FET to enter saturation region, which is a high power-operating region. Since the device is operating in a high power region in the current limiting mode, the junction temperature of the device will rise above allowable device limits and will cause damage to the FET unless thermal protection is implemented in the circuit. In order to prevent damage to the FET, a thermal protection circuit may be used to shut down or turn off the FET when the temperature exceeds a predefined level. Such a thermal protection circuit may be designed to turn the FET back on as the device temperature falls below a predefined level.

SUMMARY OF THE INVENTION

Accordingly, what is needed is a power FET switching circuit that will overcome the disadvantages of traditional fold-back current limiting methods. More specifically, what are needed are a circuit and/or method that will ensure that the operation of a power FET switch is always below its maximum operating limits. In addition, what are also needed are a circuit and/or method that will eliminate the need for temperature sensing or thermal shutdown circuits. The present invention provides these advantages and others not specifically mentioned above but described in the sections to follow.

What are described are a power FET and a replica FET on a semiconductor chip coupled to a logic control circuit on a second semiconductor chip within a single housing. A power FET and a scaled down replica of the power FET are disposed on a semiconductor chip. The power FET is used as a switch to couple a DC power source to a load. A fraction of the power FET drain current passes through the replica FET and an external sense resistor. When the voltage across the external sense resistor exceeds a maximum value based upon the maximum allowable power FET drain current, the logic control circuit enters into a pulsed gate (PG) mode of operation. The first step in the PG mode is to switch both FETs into a nonconducting state for a predefined period of time. After this time period, a ramp voltage applied between gate and source of both FETs switches them back into a current conducting state while holding the power FET drain current below its upper limit in the presence of a high capacitance or short circuit load. If the voltage across the external resistance increases above the maximum, the PG mode of operation continues. PG mode ceases and normal operation follows when the external resistance voltage remains below the established maximum. The combination of predefined non-conducting time and maximum drain current ensures operation of the power FET below maximum power dissipation limits. In other words, embodiments of the present invention keep the FET from operating in the saturation region. The PG mode of operation eliminates the need for additional temperature and thermal control circuits.

In one embodiment of the present invention, a power MOSFET and a replica of the power MOSFET disposed on a first semiconductor chip, and a logic and control circuit disposed on a second semiconductor chip are coupled and contained within a single housing. This semiconductor switching circuit utilizes negative feedback in order to maintain a drain current in the replica MOSFET that is a constant fractional value of the drain current in the power MOSFET. The replica MOSFET drain current is conducted through an external resistance. The value of the external resistance is selected in terms of the maximum allowable power MOSFET drain current in order to establish a trip-.voltage level. A voltage across the external resistance greater than the trip voltage level will cause the logic and control circuit to enter a pulse gate (PG) mode of operation. In PG mode, both MOSFETs are initially switched into and held in a non-current conducting state for a period of time. At the end of this time period, a ramp voltage is applied gate-to-source to switch both MOSFETs in a timely manner back into a current conducting state. The ramp voltage ensures the MOSFETs do not exceed maximum current limits even in the presence of an excessive capacitive load. If the voltage across the external resistance exceeds the trip voltage level as the ramp voltage is applied, both MOSFETs will again be switched off and PG mode operation will repeat. Normal operation will then be established when power MOSFET drain current is reduced and the voltage across the external resistance remains below the trip voltage level. The combination of off time and maximum power MOSFET drain current established in the PG mode thus ensures operation of the power MOSFET below maximum power dissipation limits as established according to the thermal characteristics of the package used to house the devices. Furthermore, the need for any additional temperature sensing and/or thermal control circuits are eliminated.

In another embodiment of the present invention, a power MOSFET, a second MOSFET that is a reduced scale replica of the power MOSFET, and a logic and control circuit are coupled and contained within a common housing. The drain current in the second MOSFET is a fraction of the power MOSFET drain current. The logic circuit is capable of comparing the second MOSFET drain current with a pre-settable maximum value and switching both MOSFETs into a current blocking state whenever the second MOSFET drain current exceeds the presettable maximum. The circuit enters a pulse gate modulation (PG) mode where initially both MOSFETs are switched into and held in a current blocking state for a period of time. At the end of this time period, a ramp voltage is applied gate-to-source to switch both MOSFETs back into a current conducting state in a timely fashion. The ramp voltage ensures the MOSFETs do not exceed maximum current limits even in the presence of a large capacitive load. If the second MOSFET drain current exceeds the presettable maximum during ramp voltage application, both MOSFETs will again be switched off and PG mode of operation will repeat. Normal operation will then ensue when drain current remains below the presettable maximum. The combination of off time and maximum power MOSFET drain current established in the PG mode thus ensures operation of the power MOSFET below maximum power dissipation limits. Furthermore, in the present embodiment, the logic and control circuit will switch both MOSFETs into a current blocking state whenever the input power source voltage falls below a predetermined and settable value.

Another embodiment of the present invention limits the drain current in a hybrid power MOSFET circuit by using negative feedback to stabilize the ratio of power MOSFET drain current to a scaled replica MOSFET drain current, establishing an upper limit on the replica MOSFET drain current in terms of the upper limit on the power MOSFET drain current, and switching both MOSFETs into a non-conducting state whenever the upper limit on the replica MOSFET drain current is exceeded. The circuit enters a pulse gate modulation (PG) mode where both MOSFETs are initially switched into and held in a non-current conducting state for a period of time. At the end of the time period, a ramp voltage developed by a voltage doubler circuit is applied gate-to-source to switch both MOSFETs back into a current conducting state in a short time period. The ramp voltage ensures the MOSFETs do not exceed maximum current limits even in the presence of a large capacitive load. If the replica MOSFET drain current exceeds the presettable maximum during ramp voltage application, both MOSFETs will again be switched into a non-current conducting state and PG mode of operation will repeat. Normal operation will then ensue as drain current falls below maximum limits. In the current conducting state, the operating point of the power MOSFET is in the linear region of its output characteristic curves. In the non-current conducting state, the operating point of the power MOSFET is held along a line indicating zero drain current as located on the output characteristic curves. Switching the power MOSFET between these two operating points using PG, ensures operation of the power MOSFET below its maximum power dissipation limits.

It is to be appreciated that other embodiments of the present invention may be implemented by using junction field effect transistors (JFET) and/or bipolar junction transistors (BJT), either alone or in combination with MOSFETS.

DETAILED DESCRIPTION OF THE INVENTION

In the following detailed description of the present invention, a novel current limiting technique for hybrid power MOSFET circuits, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
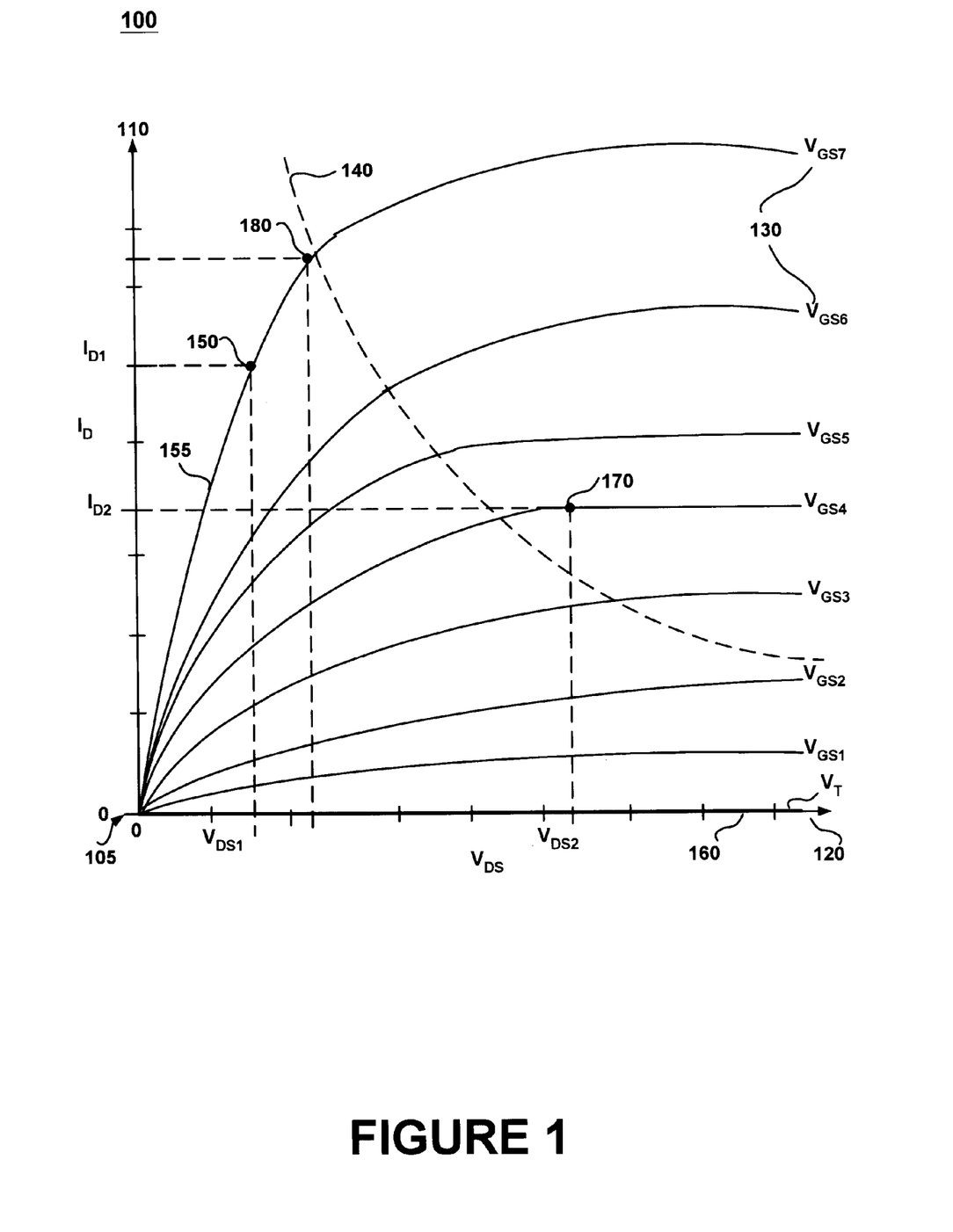
FIG. 1 is a plot of output characteristic curves for a typical Field Effect Transistor (FET) illustrating the linear operating region and maximum power dissipation limits for the FET.

FIG. 1 is a family of output characteristic curves 100 plotted as drain current ($I_D$) 110 versus drain to source voltage ($V_{DS}$) 120 for a typical Field Effect Transistor (FET). Each curve is for a given value of gate-to-source voltage ($V_{GS}$) 130. A dashed curve 140 shows maximum power dissipation limits for this FET. An operating point such as 170, ($I_{D2}$, $V_{DS2}$), located to the right of the maximum power dissipation curve, illustrates operation of the FET beyond its rated power dissipation limits.

One of the characteristic curves in FIG. 1 follows a path 155 between the origin 105 and an operating point 150, ($I_{D1}$, $V_{DS1}$). In a current conducting state, operating points for the FET may be located along this path, which is in the linear region of operation. It is important to note that power dissipation in the FET at any operating point along this path between the origin 105 and operating point 180 is below maximum power dissipation limits. When in a current blocking state, any operating point for the FET such as 160 must be located along the horizontal $V_{DS}$ axis 120 where $I_D$ approaches zero. In a current blocking state, power dissipation in the FET also approaches zero.

Figure 2:
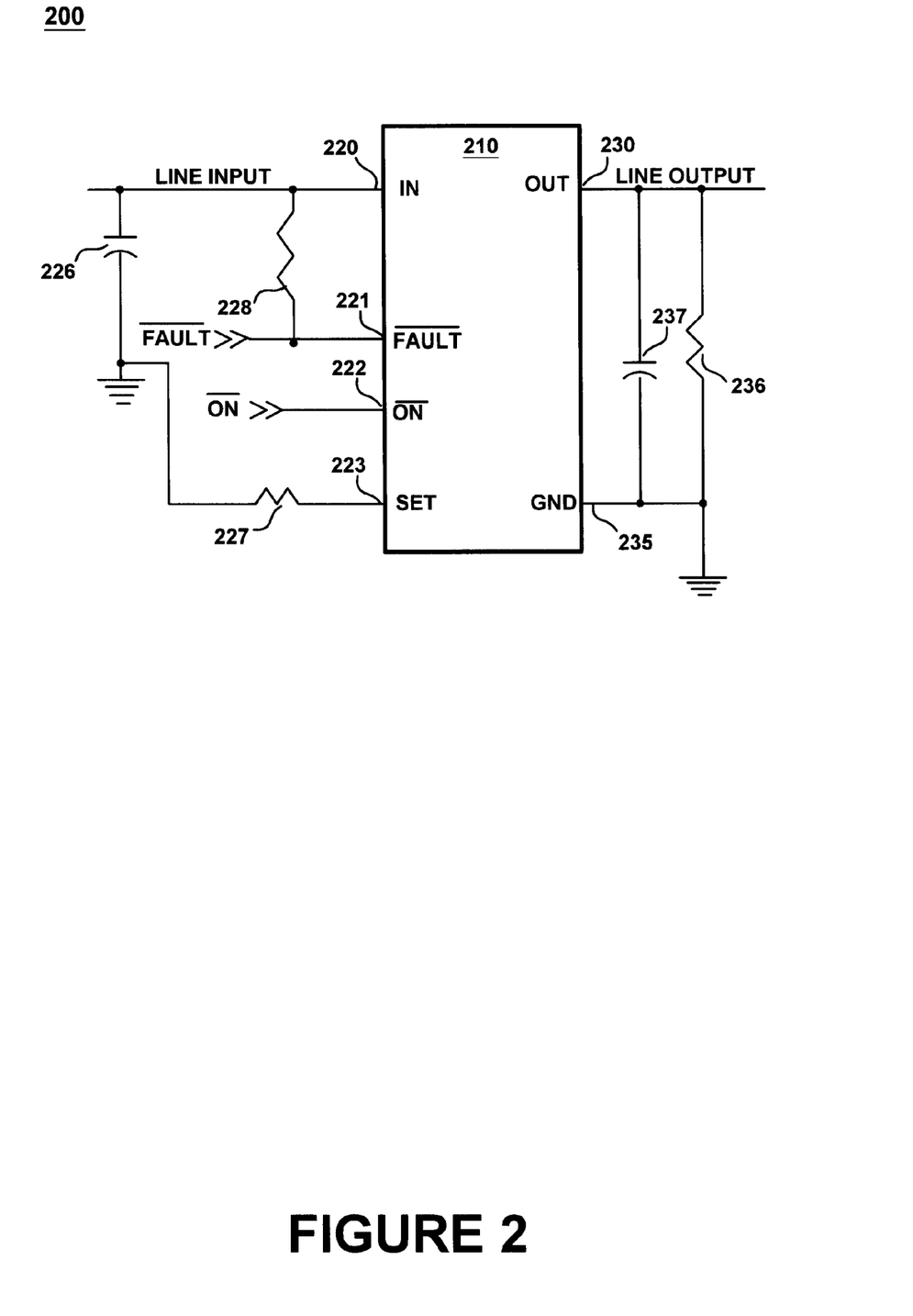
FIG. 2 is one embodiment of a semiconductor switching circuit with over current protection according to the present invention.

FIG. 2 is one embodiment of a semiconductor switching circuit with over current protection 200 according to the present invention. In this implementation, the switching circuit is contained within a housing 210, and is used in this embodiment to couple a power source to a load. An input power source is connected between the circuit IN 220 and a common ground, GND, 235. A logic input level connected to ON-BAR 222 is used as the signal to switch the circuit on or off. An external resistor 228 connected between IN 220 and FAULT-BAR 221 provides a logic signal that goes to a low state whenever the circuit is in PG mode. A second external resistor 227 connected between GND 235 and SET 223 is used to set the current limit above which the power MOSFET is switched into a non-current conducting state. An external capacitor 226 is connected between IN 220 and the common ground 235 to filter and smooth the input power source voltage. The load consists of a parallel coupling of capacitor 237 and resistance 236 connected between OUT 230 and the common ground 235.

Figure 3:
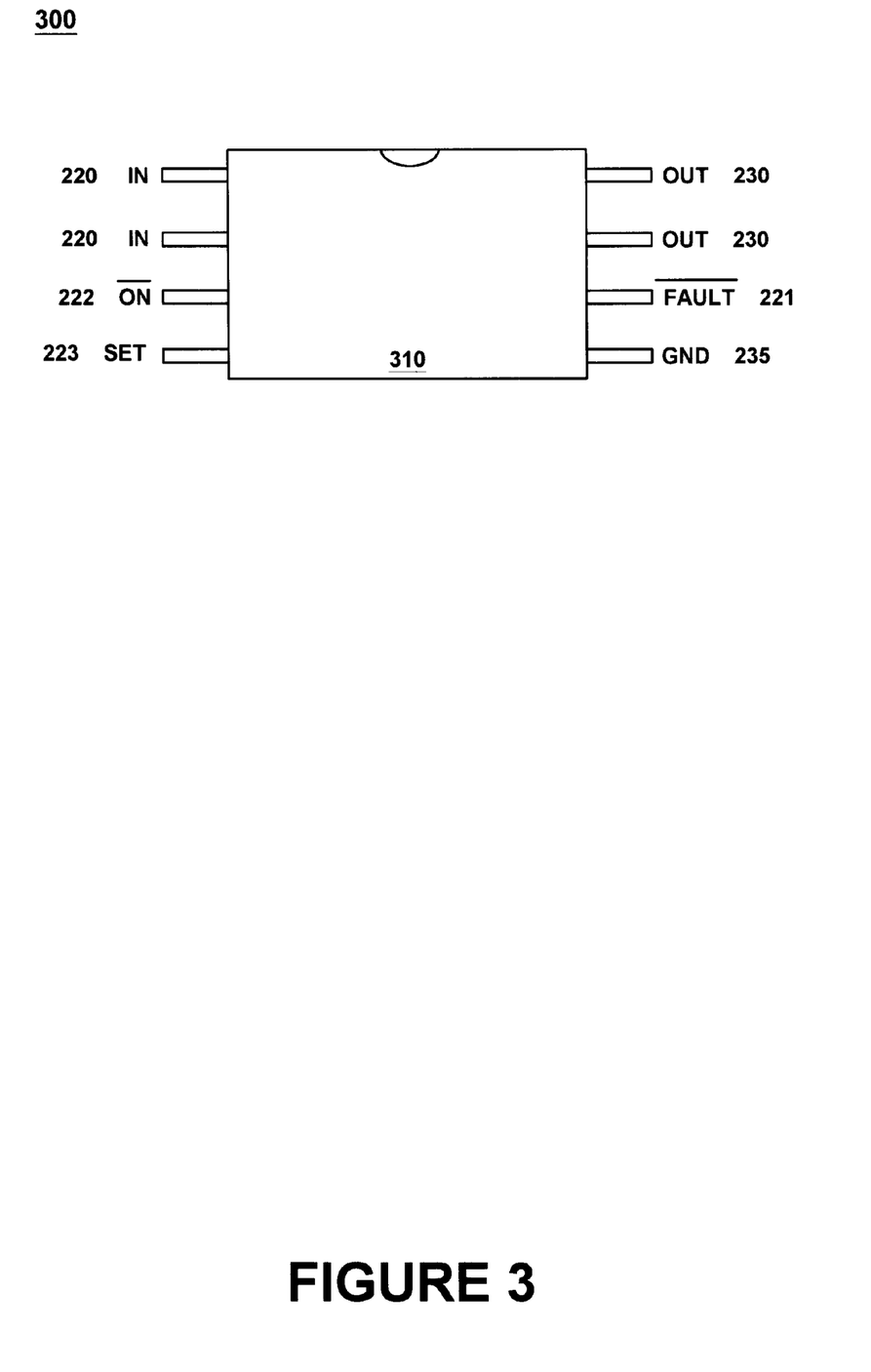
FIG. 3 is one embodiment of a semiconductor switching circuit with over current protection contained within an S08 housing according to the present invention.

FIG. 3 is one embodiment 300 of a semiconductor switching circuit with over current protection contained within an S08 housing 310 according to the present invention. The eight pins on the S08 package are referred to with the same numbers used in FIG. 2. An input power source is connected between the circuit IN 220 and a common ground, GND, 235. A logic input level connected to ON-BAR 222 is used as the signal to switch the circuit on or off. FAULT-BAR 221 provides a logic signal output that goes to a low state whenever the circuit is in PG mode. SET 223 is used to connect an external resistance for setting the current limit above which the power MOSFET is switched into a non-current conducting state. OUT 230 and the common ground 235 are pins between which any load is connected.

Figure 4:
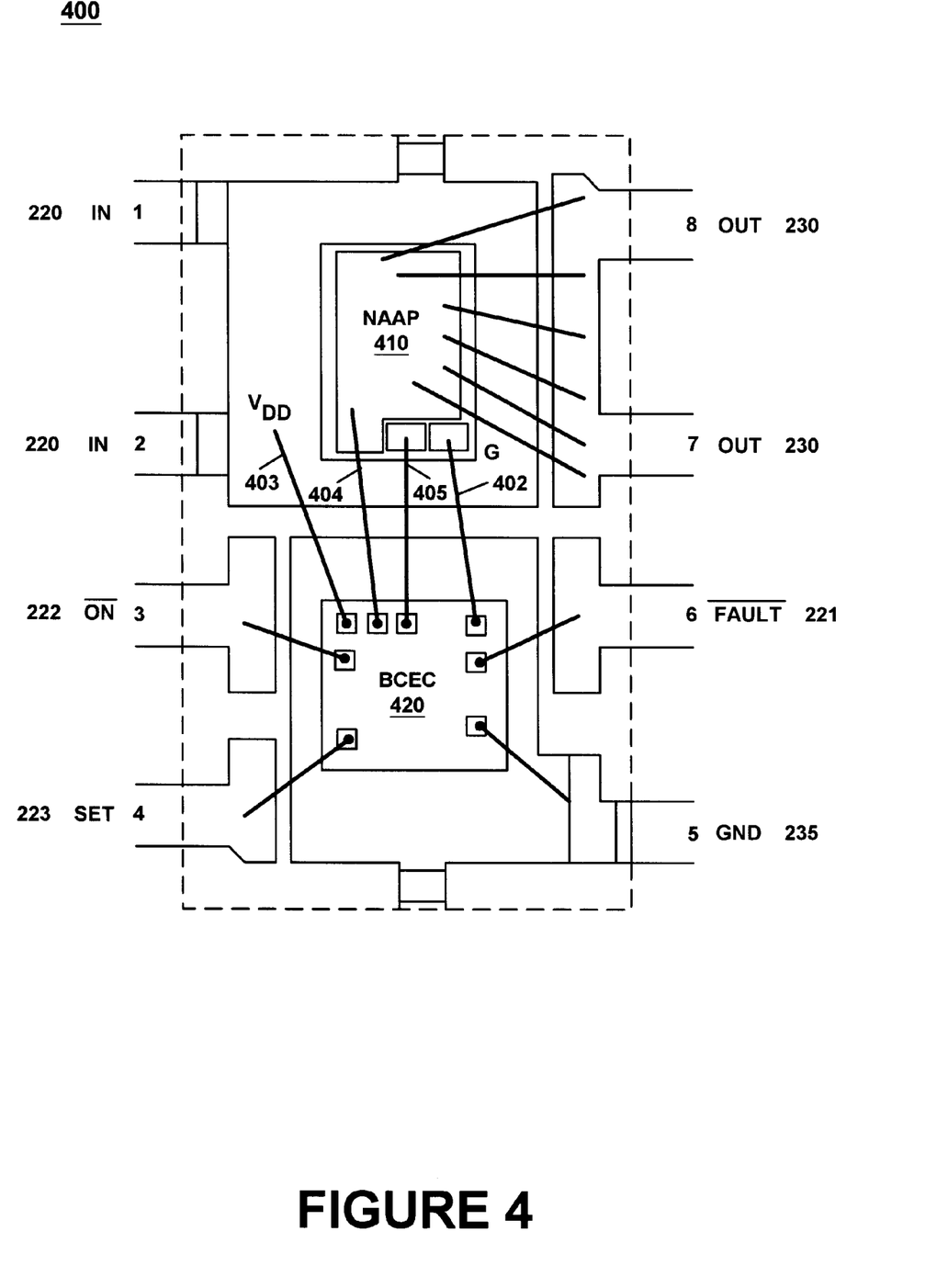
FIG. 4 is one embodiment of a bonding diagram for the two chips used in the semiconductor switching circuit with over current protection according to the present invention.

FIG. 4 is one embodiment of a bonding diagram 400 for the two chips contained within a single housing and used in the semiconductor switching circuit with over current protection according to the present invention. The external pin numbers correspond to those used with the S08 package in FIG. 3 as previously discussed. The power MOSFET and the replica power MOSFET are disposed on the first semiconductor chip 410. The drain of the power MOSFET is coupled to OUT 230. The source of the power MOSFET is coupled to the source of the replica MOSFET that is then coupled to IN 220. The gate of the power MOSFET is coupled to the gate of the replica MOSFET 402 which is then coupled to the logic and PG semiconductor chip 420. The connection 403 between $V_{DD}$ and the logic and PG chip is used by the logic circuit to detect an input voltage below an established minimum level, and switch the circuit into a shutdown mode. Connections 404 and 405 couple the MOSFET drains to the current sensing circuit on the logic and PG chip. SET 223, FAULT-BAR 221, ON-BAR 222 and GND 235 have functions as previously described and are coupled directly to the logic and PG chip accordingly.

Figure 5:
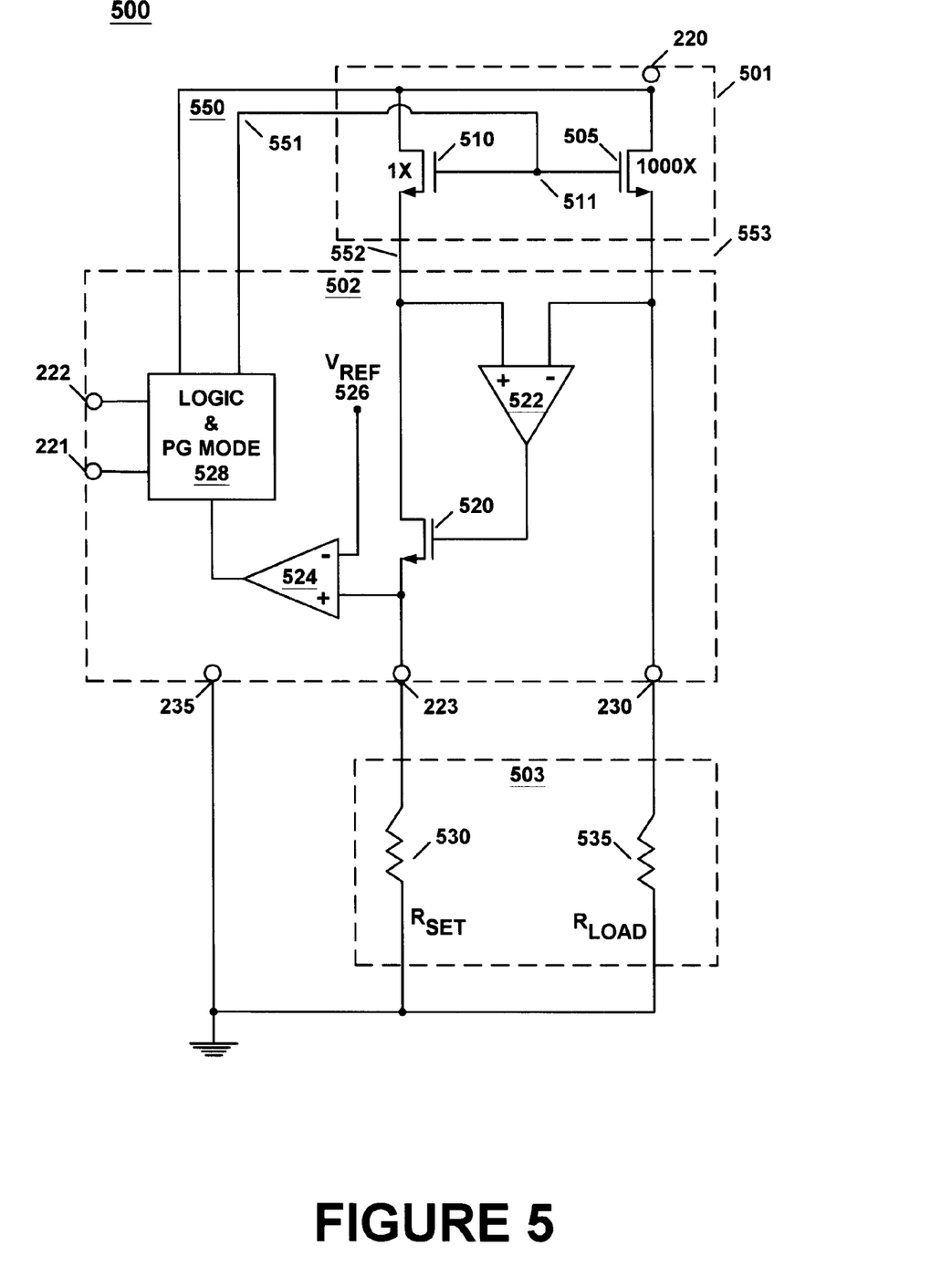
FIG. 5 is a circuit block diagram of the semiconductor switching circuit with over current protection according to the present invention.

FIG. 5 is a block diagram 500 of the semiconductor switching circuit with over current protection according to the present invention. A dashed line encloses the first semiconductor chip 501, and a second dashed line encloses the second semiconductor chip 502 forming the switching circuit. The two chips are coupled and contained within a common housing such as an S08 package. The dashed line 503 encloses an external sense resistor 530, used as a current sensor and a resistance 535 representing an external load.

The six external connections to the circuit are as discussed previously in FIGS. 2, 3 and 4, and are identified as IN 220, FAULT-BAR 221, ON-BAR 222, SET 223, OUT 230 and GND 235.

The semiconductor chip 501 consists of a power MOSFET 505 and a replica MOSFET 510 that is a scaled down version of the power MOSFET. In the present embodiment, the scale factor is one thousand to one (1000:1). The gate leads of the two MOSFETs are coupled 511, and the power MOSFET drain current will then be one thousand times greater than the replica MOSFET drain current.

A coupling 552 connects the source lead of the replica MOSFET 510 in chip 501 with the drain lead of a current sense MOSFET 520 and the positive input of a difference amplifier 522 in chip 502. A second coupling 553 connects the source lead of the power MOSFET 505 in chip 501 to the negative input of the difference amplifier 522 in chip 502. The output of the difference amplifier 522 is connected to the gate lead of the current sense MOSFET 520. These connections form a closed loop, negative feedback path that will maintain the ratio of power MOSFET drain current to replica MOSFET drain current at a constant value.

The source lead of the current sense MOSFET 520 is connected to the SET pin 223, and the current sensing resistance 530 is connected between the SET pin 223 and GND 235. A current path is thus established between IN 220, through the replica MOSFET 510, through the current sense MOSFET 520, and through the current sensing resistance 530 to GND 235. In the present embodiment, the current in this path is 1/1000 the load current passing from IN 220, through the power MOSFET 505, through OUT 230 and through the resistive load 535 to GND 235. The quotient taken as the established trip voltage level, referred to as $V_{REF}$, divided by the maximum allowable drain current in the replica MOSFET will determine a proper choice of value for the current sensing resistance 530. As power MOSFET drain current increases, the voltage at SET 223 will increase, and when the power MOSFET drain current becomes equal to its maximum allowable level, the voltage at SET 223 will equal the trip value $V_{REF}$.

The voltage level at SET 223 is coupled to the positive input of a difference amplifier 524, the negative input of which is coupled to an internally generated reference voltage 526 equal to $V_{REF}$. When the voltage level at SET 223 equals or exceeds $V_{REF}$, the output of the difference amplifier 524 that is coupled to the Logic and PG circuit 528, will cause the switching circuit to enter the PG mode of operation.

The coupling 551 connects the two coupled gate leads 511 in chip 501 to the logic and PG mode circuit 528 in chip 502. The PG mode of operation is initiated by a signal generated in the Logic and PG mode circuit 528 and applied to the two coupled gate leads 511 to switch MOSFET 505 and MOSFET 510 into current blocking states. The PG mode circuit holds both MOSFETs in a current blocking state for a given period of time, and then applies a ramp voltage to the MOSFET gates 511 to switch them back into a current conducting state. A ramp voltage is used to switch the MOSFETs into a current conducting state for a controlled time period in order to avoid exceeding MOSFET drain current limits that might be caused by a large capacitive load. One additional coupling 550 connects the input DC power source between semiconductor chip 501 and semiconductor chip 502.

Referring again to FIG. 1, the power MOSFET will have two quasi-stable operating points in the PG mode of operation. The first operating point is located along the line indicating zero drain current such as 160 when the MOSFET is in a current blocking state. The second operating point establishes an upper limit on power MOSFET drain current, and might be selected at a point close to but not greater than the drain current at operating point 160. In the PG mode of operation, the power MOSFPT is switched alternately between these two operating points. A value of maximum power MOSFET drain current is combined with PG mode switching frequency such that average power dissipated in the power MOSFET is below maximum limits.

In normal operation, the power MOSFET is in a current conducting state and a stable operating point dependent on the attached load is located such as $Q_1$ 150 ($I_{D1}$, $V_{DS}$) illustrated in FIG. 1.

Figure 6:
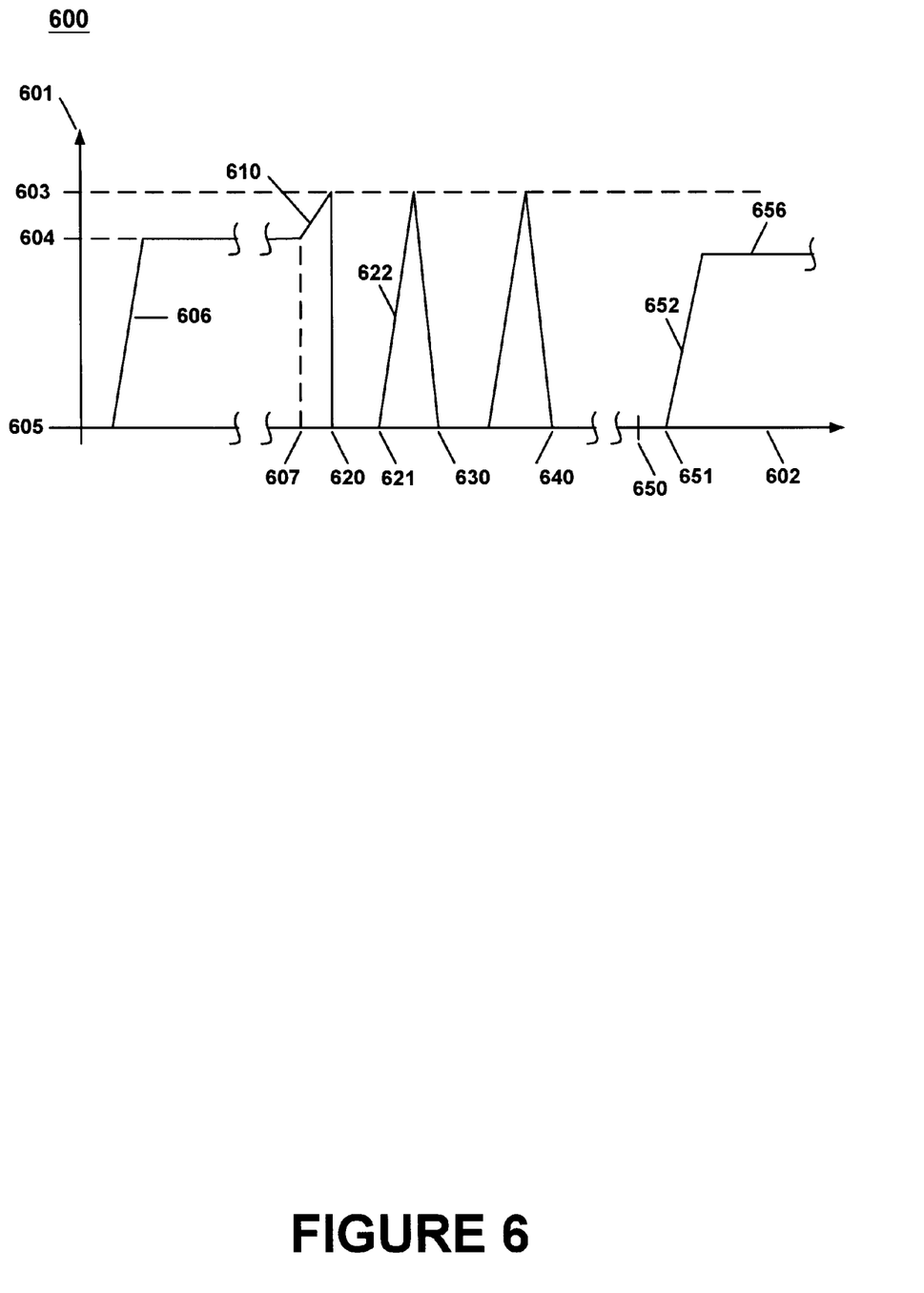
FIG. 6 is a waveform of drain current in the power MOSFET under the control of pulse gate (PG) action according to the present invention.

FIG. 6 is a waveform 600 of drain current in the power MOSFET under the control of pulsed gate (PG) mode operation according to the present invention. The vertical axis 601 is drain current and the horizontal axis 602 is time. The maximum level of power MOSFET drain current 603 along with a typical operating level of drain current 604 below the maximum level is plotted on the vertical scale. Operation of the switching circuit begins at the origin 605, and the drain current increases in a short time period along curve segment 606 to a level 604. The power MOSFET drain current at level 604 is below the maximum limit and normal operation continues.

At point 607, an increase in drain current begins along curve segment 610 until reaching point 620. At point 620, drain current reaches the established maximum level and the circuit switches into a two-step PG mode of operation. In the first step, beginning at point 620, the power MOSFET is switched into a current blocking state for a delay time period lasting until point 621. The second step begins at this time, when a ramp voltage is applied to the gate lead of the power MOSFET to switch it back into a current conducting state over a controlled time period. The power MOSFET drain current increases along the curve segment 622. However, at point 630, the power MOSFET drain current again reaches the established maximum level and the circuit enters into a second two-step PG mode of operation between points 630 and 640. Additional two-step PG modes will continue until the load is adjusted such that the power MOSFET drain current is maintained below the maximum level.

A following two-step PG mode begins at point 650 with delay time lasting until point 651. In the second step beginning at point 651, the drain current begins to ramp up along the curve segment 652. The drain current stabilizes according to the existing load at a level 656 below maximum limits and normal operation follows.

It is to be noted that the two-step PG mode of operation can be described in terms of two time periods. The first time period is a delay time such as between points 620 and 621. The second time period is the ramp voltage time such as between points 621 and 630. Timing circuits within the logic and PG mode circuitry establish time values for delay time and ramp voltage time. The PG mode time period is the sum of the delay time added to the ramp voltage time, such as between 630 and 640. The frequency of operation in the PG mode is taken as the reciprocal of the PG mode time period.

Even though the instantaneous power dissipated in the power MOSFET may momentarily exceed maximum limits during switching transients, the PG mode of operation is designed such that the average power dissipated in the power MOSFET is below maximum limits. That is to say, a value of maximum power MOSFET drain current is combined with PG mode such that the average power dissipated in the power MOSFET is below maximum limits.

Figure 7A:
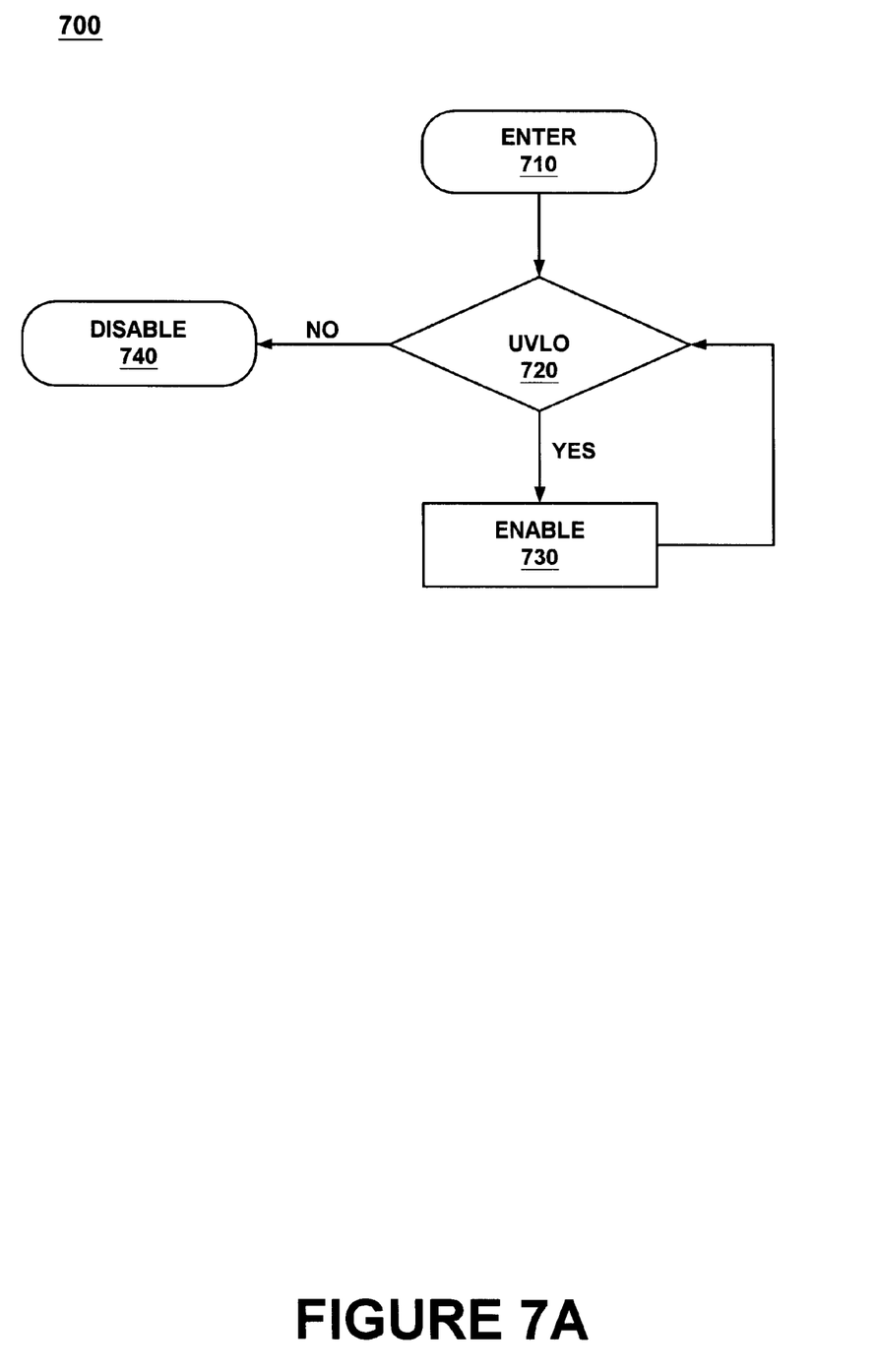
FIGS. 7A and 7B are flow charts 700 showing operational steps executed by the logic and PG circuits according to the present invention.
Figure 7B:
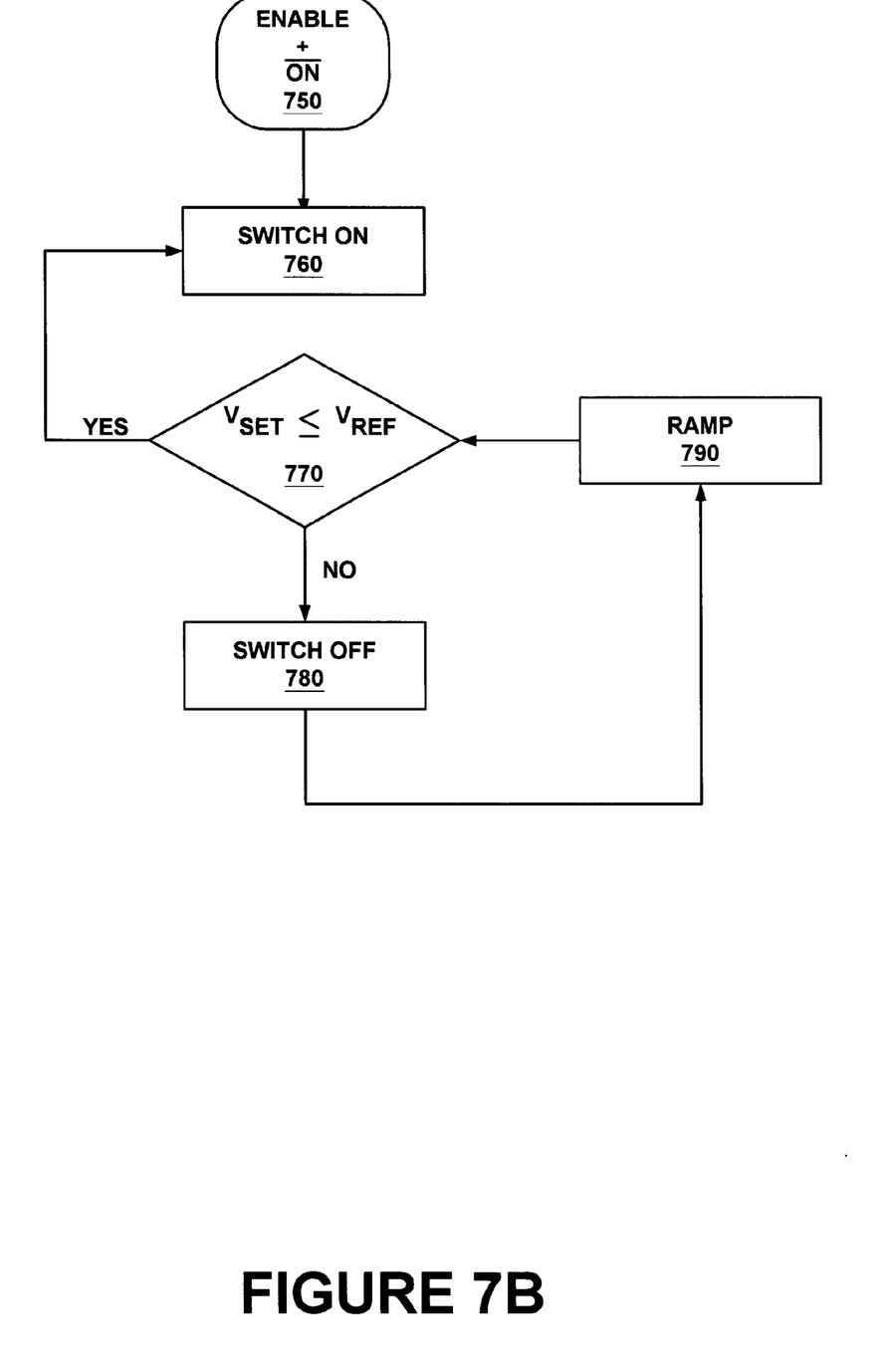

FIGS. 7A and 7B are flow charts 700 showing the steps executed by the logic and PG mode circuits according to the present invention. In step 710, the flow chart in FIG. 7A is activated upon application of external power. Step 720 compares the voltage level of the applied external power with an internally stored minimum value. If the external power voltage level is above the minimum value, the flow chart advances to step 730 where the logic and PG mode circuits are enabled. Operation then continues around the loop defined by steps 720 and 730 to provide a continuous check on the external power voltage level. This operational loop continues as long as external power is applied and the voltage level of the external power is above the minimum value. If the external power voltage level falls below the minimum value in step 720, the flow chart advances to step 740 in which the logic and PG mode circuits are disabled.

The flow chart in FIG. 7B is operational only when the logic and PG mode circuits are enabled in step 730 of the flow chart of FIG. 7A. Step 750 in FIG. 7B commences operation of this flow chart when the logic and PG mode circuits are enabled and the operational signal ON-BAR is activated. The flow chart then enters step 760 in which the power MOSFET and the replica MOSFET are both switched into current conducting states. The current in the power MOSFET increases according to the attached load, and the current in the replica MOSFET tracks accordingly. The flow chart advances to step 770 where the voltage across the external sense resistance $V_{SET}$ is compared with the reference trip voltage $V_{REF}$. As long as $V_{SET}$ remains less than $V_{REF}$, the power MOSFET current is known to be below maximum limits. The flow chart returns to step 760 and continues to track the load current. The loop defined by steps 760 and 770 illustrate the normal mode of operation for this switching circuit where the load current may vary, but always remains within maximum operating limits.

Continuing with the flow chart in FIG. 7B, if $V_{SET}$ is found to be greater than $V_{REF}$ in step 770, the flow chart will advance to step 780. The first step in the PG mode of operation is step 780, in which both the power MOSFET and the replica MOSFET are switched into a current blocking state for a time period equal to the established delay time. After the delay time has elapsed, the flow chart advances to step 790 in which a ramp voltage is applied to the gates of the power MOSFET and the replica MOSFET to switch them into a current conducting state in a preset period of time. The flow chart then advances to step 770 in which the sense voltage $V_{SET}$ is compared with the reference trip voltage $V_{REF}$. As long as $V_{SET}$ is found to be greater than $V_{REF}$ in step 770, the circuit will remain in the PG mode of operation by advancing around the loop consisting of steps 770, 780 and 790. Whenever $V_{SET}$ becomes less than $V_{REF}$ in step 770, the flow chart will return to step 760 and normal operation will continue around loop 760 and 770 as long as the power MOSFET current remains below maximum limits.

It is to be appreciated that other embodiments of the present invention may be implemented by using junction field effect transistors (JFET) and/or bipolar junction transistors (BJT), either alone or in combination with MOSFETs. In the embodiment of the present invention illustrated in FIG. 5, the MOSFETs 505, 510 and 520 are all n-channel devices. Another embodiment of the present invention may be implemented by replacing these MOSFETs with p-channel devices, in which case a charge pump could be included.

The preferred embodiment of the present invention, a novel current limiting technique for hybrid power MOSFET circuits, is thus described. While the present invention has been described in particular embodiments, it should be appreciated that the present invention should not be construed as limited by such embodiments, but rather construed according to the below claims.

What is claimed is:

1. A switching circuit with over current protection comprising:
   at least one power switch;
   a current sensor for sensing current in said at least one power switch, said current sensor comprising at least one reduced scale replica of said at least one power switch;
   a pulsed gate (PG) mode circuit for generating control signals for said at least one power switch, and
   a logic circuit cooperating with said PG mode circuit for switching said at least one power switch between current conducting and current blocking states responsive to said current sensor.

2. A switching circuit with over current protection according to claim 1 wherein said at least one power switch is selected from the group consisting of bipolar junction transistors (BJT) and field effect transistors (FET).

3. A switching circuit with over current protection according to claim 1 wherein said at least one power switch is a power FET and said current sensor is a reduced scale replica of said power FET disposed on a first semiconductor chip, and said PG mode circuit and said logic circuit are disposed on a second semiconductor chip.

4. A switching circuit with over current protection according to claim 3 wherein said first semiconductor chip and said second semiconductor chip are coupled and disposed in a common housing.

5. A switching circuit with over current protection according to claim 1 wherein negative feedback is utilized to maintain the ratio of current in said at least one power switch to the current in said current sensor at a predetermined, fixed value.

6. A switching circuit with over current protection according to claim 1 wherein an upper limit on current in said current sensor is predetermined and settable in accordance with the maximum allowable current in said power switch.

7. A switching circuit with over current protection according to claim 1 wherein said PG mode circuit operates at a predetermined switching frequency established in accordance with maximum power dissipation limits of said power switch.

8. A switching circuit with over current protection according to claim 1 wherein a ramp voltage used to switch said power switch from a current blocking state to a current conducting state ensures that current in said power switch is below said established maximum.

9. A hybrid current limiting circuit for power MOSFETS with over current protection comprising:
　a power MOSFET;
　a second MOSFET that is a reduced scale replica of said power MOSFET, wherein drain current in said power MOSFET is proportional to drain current in said second MOSFET, and
　a logic and pulsed gate (PG) mode circuit capable of comparing drain current in said second MOSFET with a presettable current level and switching said second MOSFET and said power MOSFET into current blocking states when said second MOSFET drain current exceeds said presettable current level.

10. A hybrid current limiting circuit for power MOSFETS with over current protection according to claim 9 wherein a first semiconductor chip comprising said power MOSFET and said second MOSFET is coupled to a second semiconductor chip comprising logic and PWM circuits.

11. A hybrid current limiting circuit for power MOSFETS with over current protection according to claim 10 wherein said first semiconductor chip and said second semiconductor chip are disposed within a common housing.

12. A hybrid current limiting circuit for power MOSFETS with over current protection according to claim 9 wherein said presettable current level is proportional to the maximum allowable drain current in said power MOSFET and is established by a resistance coupled to said semiconductor chips.

13. A hybrid current limiting circuit for power MOSFETS with over current protection according to claim 9 wherein a pulsed gate (PG) mode circuit is utilized in said logic circuit to ensure said power MOSFET is operated below its maximum power dissipation limit.

14. A hybrid current limiting circuit for power MOSFETS with over current protection according to claim 9 wherein a ramp voltage developed by a voltage doubler in said logic circuit applied as gate to source voltage switches said power MOSFET into a current conducting state while maintaining said power MOSFET drain current below said presettable current level.

15. A hybrid current limiting circuit for power MOSFETS with over current protection according to claim 9 wherein a difference voltage between source lead of said power MOSFET and source lead of said second MOSFET is used to develop a negative feedback voltage that is simultaneously applied to the gate leads of said power MOSFET and said second MOSFET to maintain the ratio of said power MOSFET drain current to said second MOSFET drain current.

16. A hybrid current limiting circuit for power MOSFETS with over current protection according to claim 9 wherein said logic circuit switches said power MOSFET and said second MOSFET into a current blocking state whenever the input power source voltage is below a predetermined value.

17. A semiconductor switching circuit with over current protection according to claim 9 wherein said power MOSFET is always operated along the linear region of its output characteristic curves in the current conducting state, and along a line indicating zero drain current in the current blocking state.

18. A method of limiting power MOSFET power dissipation in a hybrid switching circuit comprising the steps of:
　using negative feedback to maintain the ratio of drain current in a power MOSFET to drain current in a replica MOSFET;
　sensing said replica MOSFET drain current and comparing with a maximum presettable level, and
　entering a pulsed gate (PG) mode of operation wherein said power MOSFET is alternately switched between a current conducting state and a current blocking state whenever said replica MOSFET drain current exceeds said maximum presettable level.

19. A method according to claim 18 wherein said maximum presettable level of said replica MOSFET drain current is a fractional value of the maximum allowable power MOSFET drain current.

20. A method according to claim 18 wherein said maximum presettable level of said replica MOSFET drain current is established by the value of an external resistance coupled to said hybrid switching circuit.

21. A method according to claim 18 wherein a ramp voltage developed by a voltage doubler circuit applied as gate to source voltage maintains said power MOSFET drain current below a maximum drain current value when switching said power MOSFET from a current blocking state to a current conducting state.

22. A method according to claim 18 wherein a value for said power MOSFET maximum drain current combined with a switching frequency for said PG mode are selected to provide operation of said power MOSFET within maximum power dissipation limits.

23. An electronic device comprising:
　a FET power integrated circuit for supplying power;
　a current sensor comprising a reduced scale replica circuit of said FET power integrated circuit, for sensing current of said FET power integrated circuit, and
　a modulator, responsive to said current sensor, for modulating said FET power integrated circuit when said current of said FET exceeds a maximum threshold, wherein said FET power integrated circuit remains in a low power region when on.

24. An electronic device as described in claim 23 wherein said modulator comprises a pulsed gate (PG) mode circuit.

25. An electronic device as described in claim 23 wherein said modulator modulates said FET power integrated circuit off for a short duration to allow device cooling.

26. An electronic device as described in claim 23 wherein said FET power integrated circuit is disposed on a first semiconductor substrate and wherein said modulator and said current sensor are both disposed on a second semiconductor substrate.

27. An electronic device as described in claim 23 wherein said first and second semiconductor substrates are co-packaged in a common housing.

28. An electronic device as described in claim 23 wherein said FET power integrated circuit is a MOSFET device.

* * * * *